(12) United States Patent
Arvin et al.

(10) Patent No.: US 9,190,376 B1
(45) Date of Patent: Nov. 17, 2015

(54) ORGANIC COATING TO INHIBIT SOLDER WETTING ON PILLAR SIDEWALLS

(71) Applicant: International Business Machines Corporation, Armonk, NY (US)

(72) Inventors: Charles L. Arvin, Savannah, GA (US); Brian M. Erwin, Lagrangeville, NY (US); Eric D. Perfecto, Poughkeepsie, NY (US); Wolfgang Sauter, Eagle-Vail, CO (US); Thomas A. Wassick, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/277,832

(22) Filed: May 15, 2014

(51) Int. Cl.
*H01L 23/48* (2006.01)
*H01L 23/00* (2006.01)

(52) U.S. Cl.
CPC ............... *H01L 24/13* (2013.01); *H01L 24/11* (2013.01); *H01L 2224/1182* (2013.01); *H01L 2224/13582* (2013.01)

(58) Field of Classification Search
CPC ... H01L 24/13; H01L 24/11; H01L 21/76852; H01L 21/76885; H01L 23/49811
USPC ........................................... 257/737; 438/614
See application file for complete search history.

(56) References Cited

U.S. PATENT DOCUMENTS

| | | | |
|---|---|---|---|
| 8,441,124 B2 | 5/2013 | Wu et al. | |
| 8,637,392 B2 | 1/2014 | Arvin et al. | |
| 2005/0017376 A1 | 1/2005 | Tsai | |
| 2011/0237480 A1* | 9/2011 | Mizutani et al. | 510/175 |
| 2011/0304042 A1* | 12/2011 | Lin et al. | 257/737 |
| 2012/0178251 A1* | 7/2012 | Lim et al. | 438/613 |

* cited by examiner

*Primary Examiner* — Trung Q Dang
(74) *Attorney, Agent, or Firm* — L. Jeffrey Kelly

(57) ABSTRACT

The present invention relates generally to and more particularly, to a method of fabricating a pillar interconnect structure with non-wettable sidewalls and the resulting structure. More specifically, the present invention may include exposing only the sidewalls of a pillar to an organic material that reacts with metal of the pillar to form an organo-metallic layer on sidewalls of the pillar. The organo-metallic layer may prevent solder from wetting on the sidewalls of the pillar during subsequent bonding/reflow processes.

14 Claims, 15 Drawing Sheets

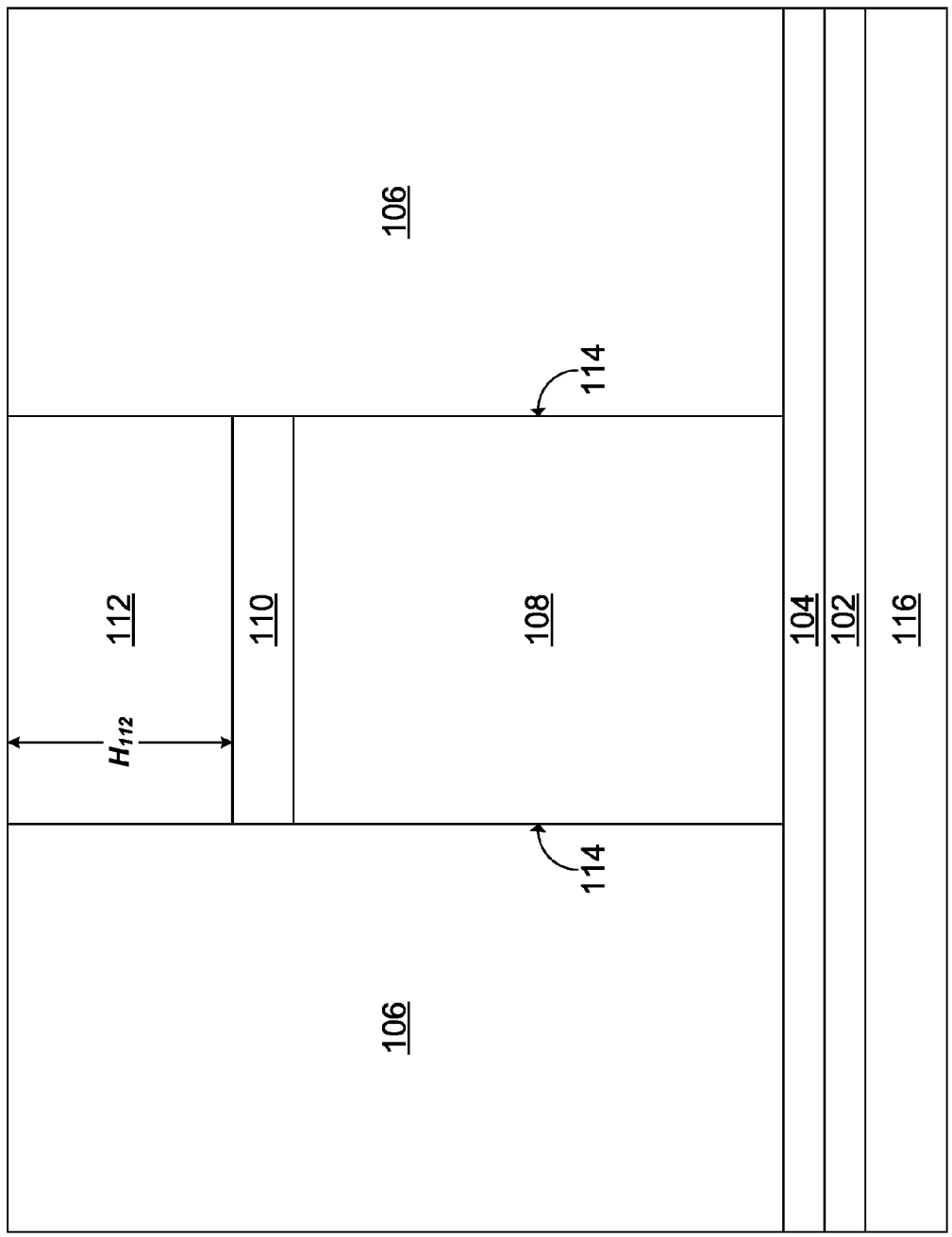

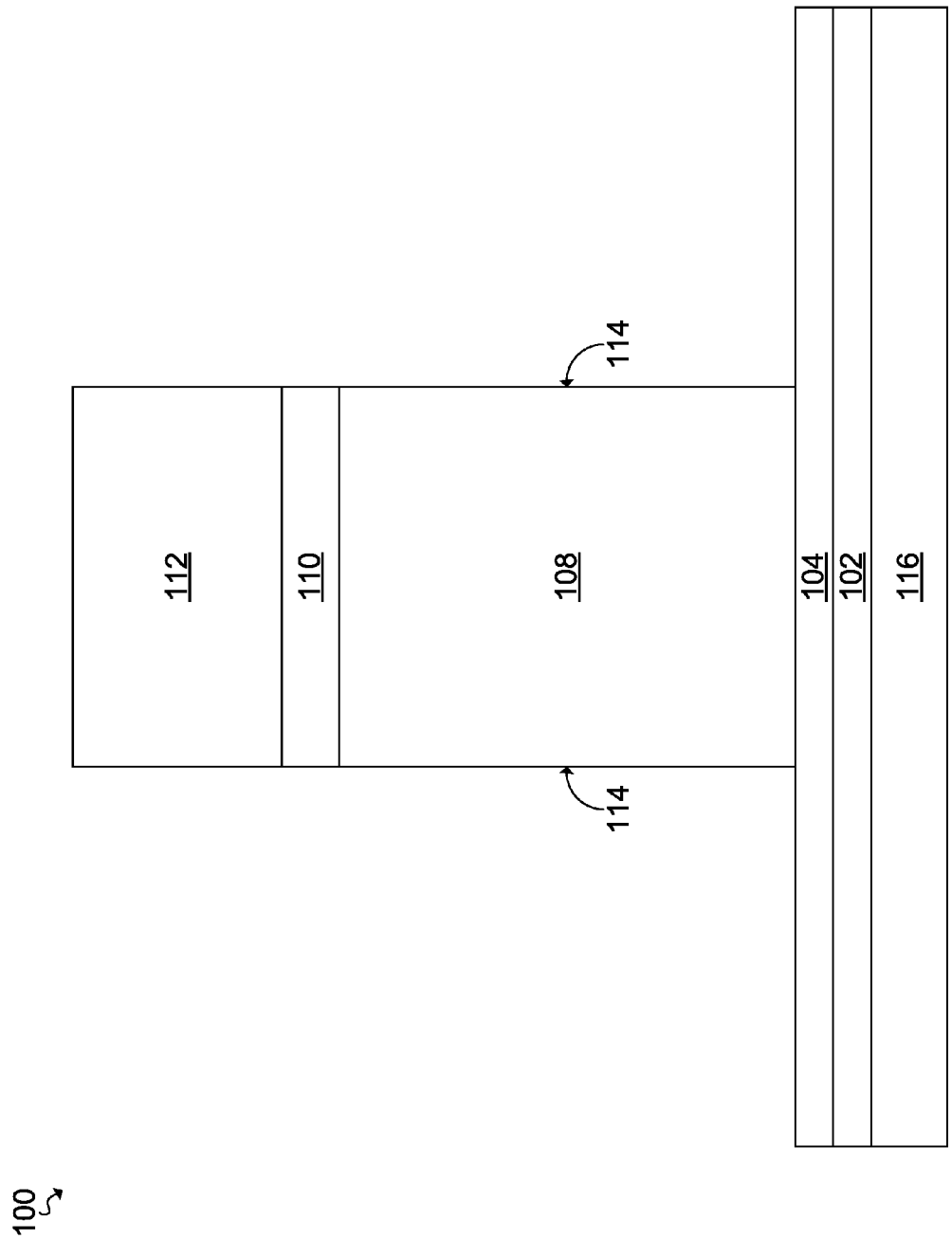

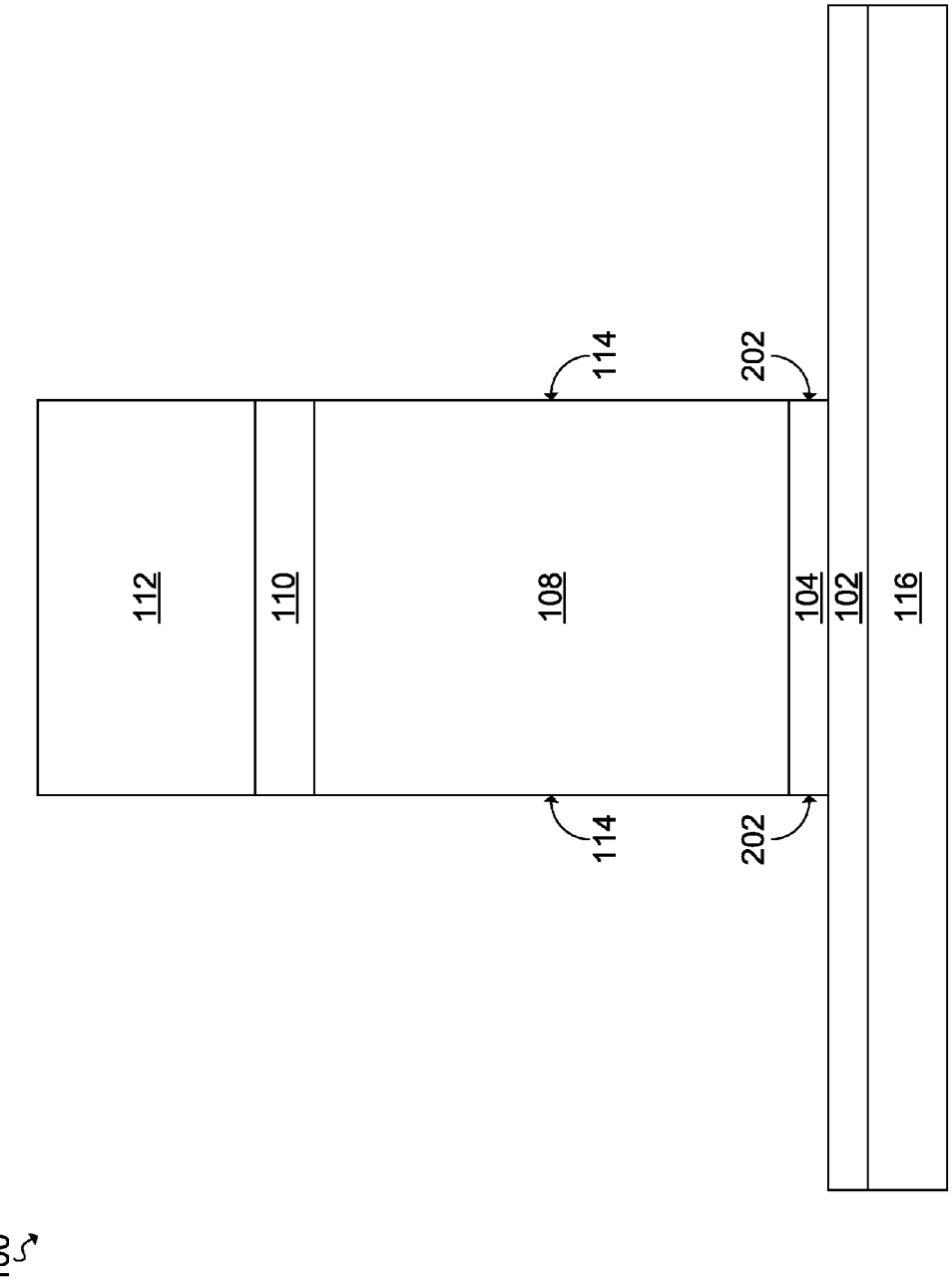

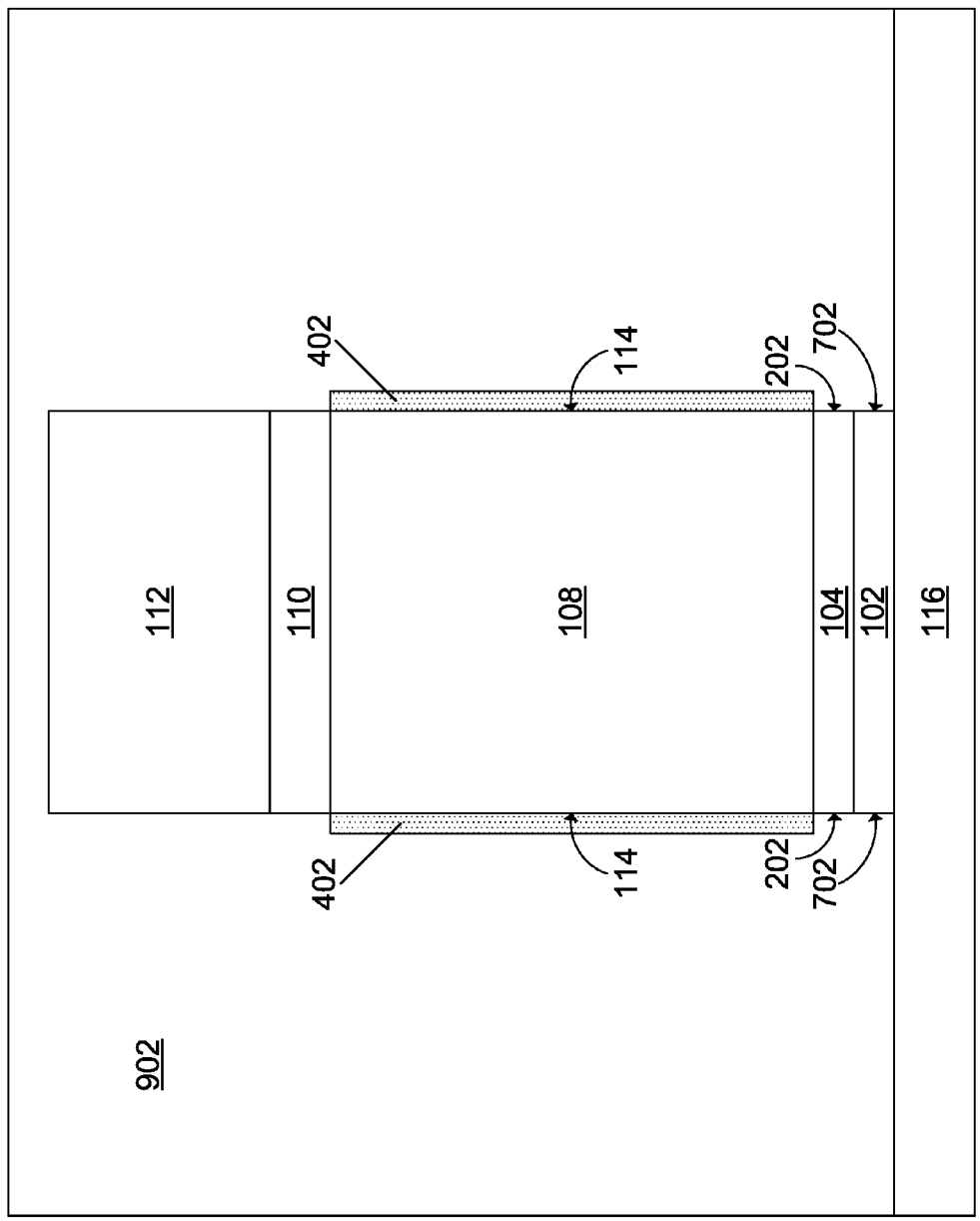

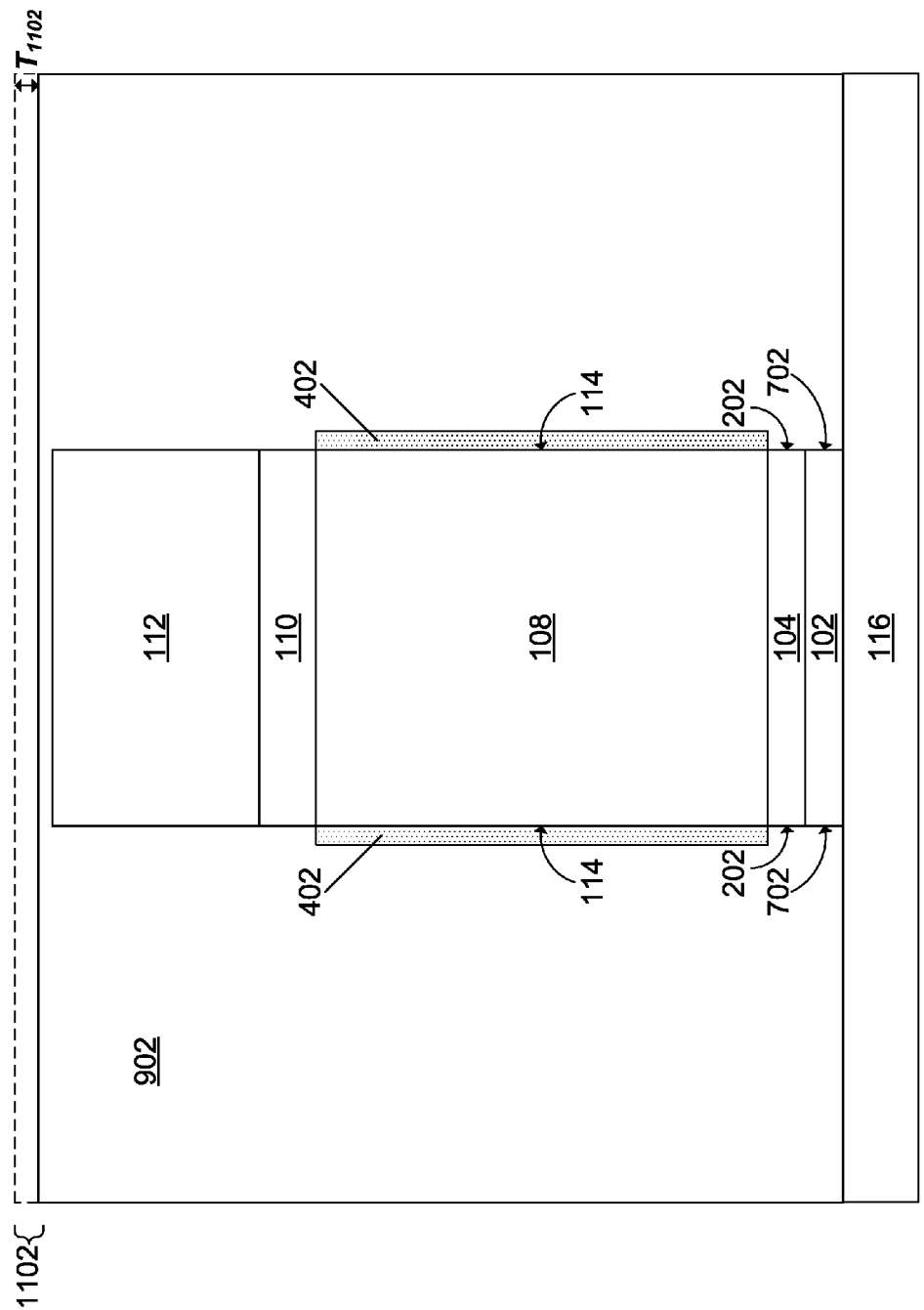

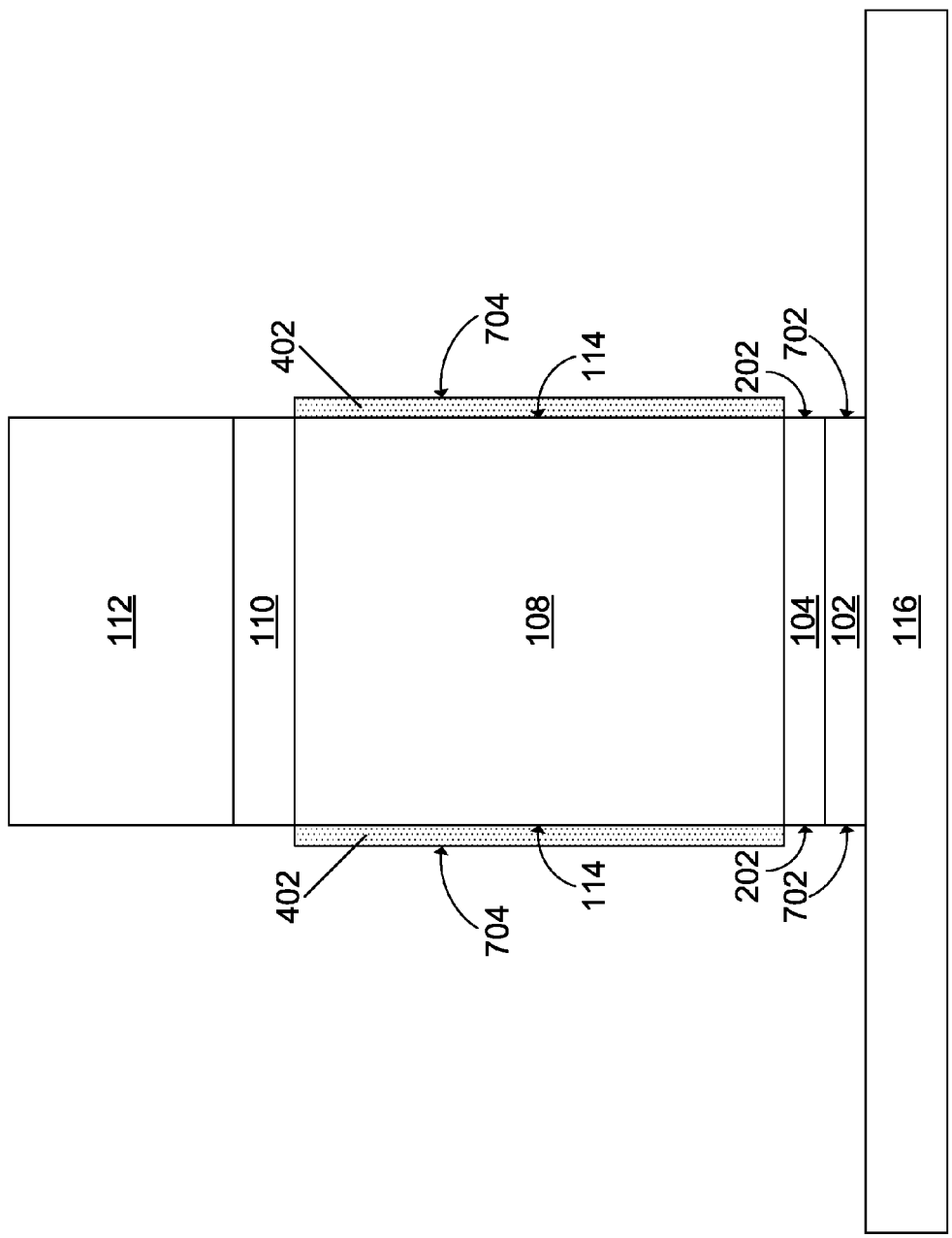

ORGANIC COATING TO INHIBIT SOLDER WETTING ON PILLAR SIDEWALLS

BACKGROUND

The present invention relates generally to semiconductor structures and methods of manufacture and, more particularly, to solder interconnect structures with non-wettable sidewalls and methods of manufacturing the same.

Copper pillars are a chip-to-chip interconnect technology used to enhance electromigration performance, to reduce the pitch of interconnects, and to provide for a larger gap, or standoff, between individual chips for underfill flow over conventional solder controlled collapse chip connections (C4 connections). In copper pillar technology, a small amount of solder is still required to connect and join the copper pillars of one chip to a pad of another chip or substrate. However, it is difficult to prevent the solder from wetting to the sidewalls of copper pillars. This sidewall wetting may reduce the gap or standoff, therefore limiting underfill flow between the one chip and the other chip or substrate. In addition, the sidewall wetting can sometimes lead to solder bridging or shorting between two adjacent copper pillars in tight pitch applications. Typically, the pitch between copper pillars must be increased to prevent or alleviate the bridging or shorting.

SUMMARY

According to an embodiment, a method is disclosed. The method may include: forming an organic layer on a pillar, such that only an entire sidewall of the pillar is in direct contact with the organic layer; annealing the pillar and the organic layer, such that an organic material in the organic layer and a metal in the pillar react to form a non-wettable organo-metallic layer along the entire sidewall of the pillar; and removing the organic layer, such that the non-wettable organo-metallic layer remains on the entire sidewall of the pillar.

According to another embodiment, a method is disclosed. The method may include: forming a pillar structure on an underlying layer, the pillar structure having a pillar, a plate on an upper surface of the pillar, and a solder layer on the plate; forming an organic layer on the underlying layer surrounding the pillar structure, the organic layer in direct contact with an entire sidewall of the pillar and not in contact with the upper surface of the pillar; annealing the pillar structure and the organic layer, such that an organic material in the organic layer and a metal in the pillar react to form a non-wettable organo-metallic layer along the entire sidewall of the pillar; and removing the organic layer, such that the non-wettable organo-metallic layer remains on the entire sidewall of the pillar.

According to another embodiment, a structure is disclosed. The structure may include: a pillar on an underlying layer; a plate on the pillar; a solder layer on the plate, wherein the solder layer does not contact any portion of the pillar; and a non-wettable organo-metallic layer along an entire sidewall of the pillar.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

FIGS. 1A-1D are a cross section views illustrating the preliminary process steps of forming a pillar structure, according an embodiment of the present invention.

FIG. 2 is a cross section view illustrating removing a portion of a conductive layer from the pillar structure adjacent to a pillar is shown, according an embodiment of the present invention.

FIG. 10 is a cross section view illustrating forming an organo-metallic layer on pillar sidewalls is shown, according an embodiment of the present invention.

FIG. 11 is a cross section view illustrating removing a portion of the organic layer to prepare it for stripping, according an embodiment of the present invention.

FIG. 12 is a cross section view illustrating removing the organic layer, according an embodiment of the present invention.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
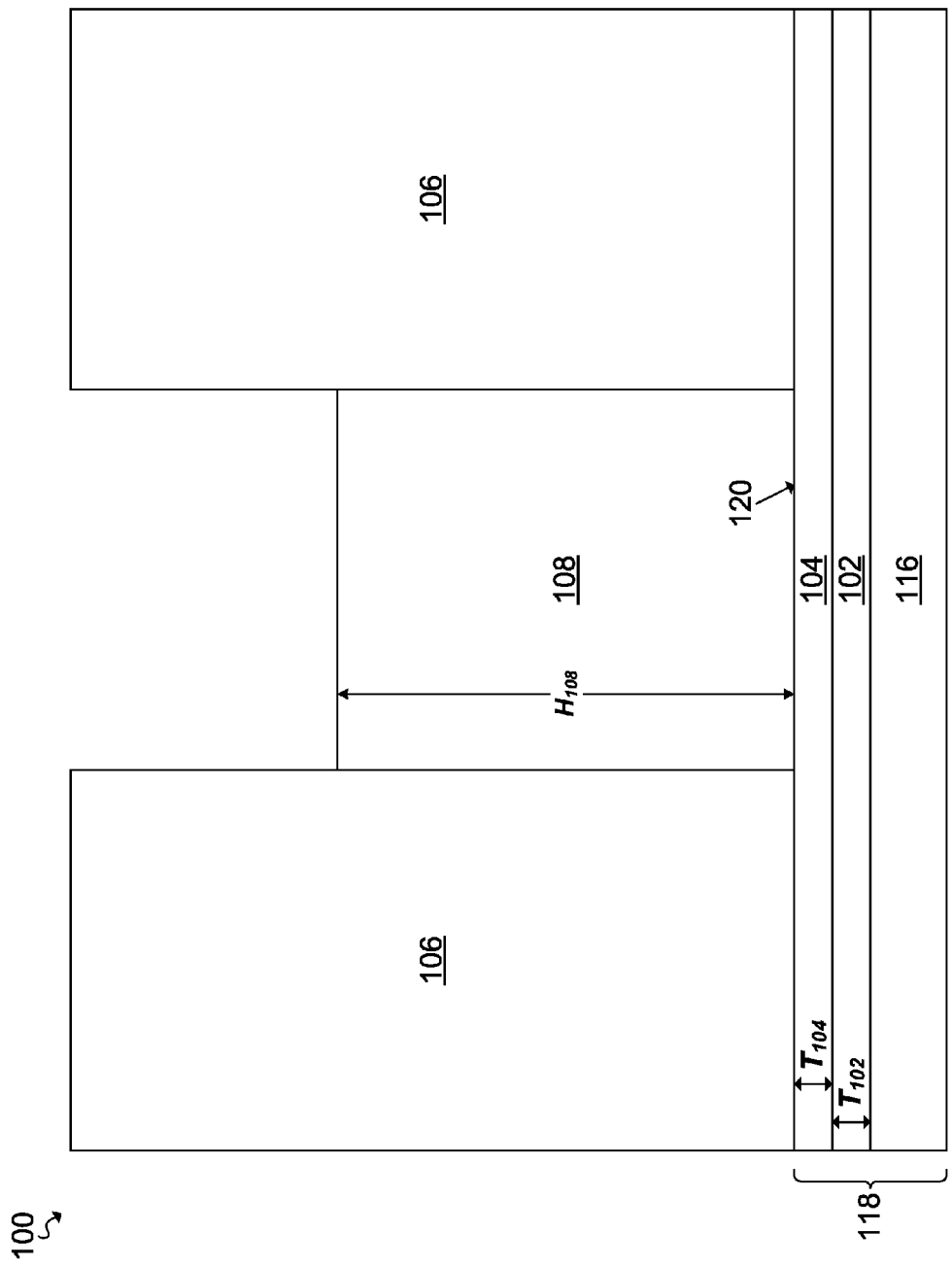

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates to semiconductor structures and methods of manufacture and, more particularly, to pillar interconnect structures with non-wettable sidewalls and methods of manufacturing the same. More specifically, the present invention utilizes an organic material that reacts with metal of the pillar interconnect to form an organo-metallic layer on sidewalls of the pillar that does not wet solder during subsequent bonding/reflow processes. Embodiments by which to from a non-wettable organo-metallic layer on the sidewalls of a copper pillar are described below in detail with reference to FIGS. 1A-12. A method of forming a pillar structure is described in detail below with reference to FIGS. 1A-1D. An embodiment by which to form the non-wettable organo-metallic layer on copper sidewalls of the pillar structure is described below in detail with reference to FIGS. 2-7. Another embodiment by which to form the non-wettable organo-metallic layer on copper sidewalls of the pillar structure is described below in detail with reference to FIGS. 8-12.

Referring now to FIGS. 1A-1D, cross section views illustrating the preliminary process steps of forming of a pillar structure 100 are shown. In particular, FIG. 1A illustrates forming a liner 102 on a substrate 116. The substrate 116 may be either a dielectric layer formed above a device (not shown) or a semiconductor substrate. In an embodiment, the substrate 116 may be composed of a photosensitive polyimide (PSPI). The liner 102 may be formed using any conventional deposition technique known in the art, such as, for example, atomic layer deposition (ALD), chemical vapor deposition (CVD), low pressure CVD (LPCVD), physical vapor deposition (PVD), molecular beam deposition (MBD), pulsed laser deposition (PLD), liquid source misted chemical deposition (LSMCD), sputtering, or spin-on deposition. In an embodiment, the liner 102 may be composed of a metal or a metal alloy such as, for example, titanium, titanium tungsten, or titanium tungsten chrome copper. In an embodiment, the liner 102 may have a thickness $T_{102}$ ranging from approximately 0.125 μm to approximately 0.205 μm. The liner 102 may act as an adhesion layer to the underlying substrate 116 as well as a barrier layer to prevent solder from penetrating the underlying structures.

A conductive layer 104 may be deposited on the liner 102 using any conventional process, such as those listed above. In an embodiment, the conductive layer 104 may be composed of a conductive metal, such as, for example, nickel, copper, or alloys thereof. The conductive layer 104 may include a seed layer (not shown), deposited on the liner 102 first using any conventional process, such as those listed above. The seed layer may encourage the adhesion of the conductive layer 104 to the liner 102. The seed layer may be composed of a metal or metal alloy, such as, for example, titanium, titanium tungsten, or titanium tungsten chrome copper. In an embodiment, the conductive layer 104 may have a thickness $T_{104}$ ranging from approximately 0.1 μm to 0.6 μm. Together, the substrate 116, the liner 102, and the conductive layer 104 may considered an underlying layer 118.

A photoresist material 106 may be deposited on the conductive layer 104 using any conventional deposition technique, such as those listed above. In an embodiment, the photoresist material 106 may be deposited, for example, using a dry film lamination technique or spin on liquid resist technique. The photoresist material 106 may then be subjected to a conventional lithographic and etching process selective to the conductive layer 104 (i.e., light exposure, development, and ashing) to form an opening (not shown). Thereafter, a pillar 108 may be formed in the opening and in contact with the conductive layer 104 by depositing a conductive material in the opening. In an embodiment, the conductive material may be copper or an alloy thereof. In another embodiment, a different metal/metal alloy may be used for the pillar 108 such as, for example, cobalt or nickel. Although other metals are contemplated by the invention, copper or copper alloys will be referred to hereinafter as the material used with the invention, but this should not be considered a limiting feature. The pillar 108 may have a bottom surface 120 in contact with the conductive layer 104. The pillar 108 may have a height $H_{108}$ ranging from approximately 20 μm to approximately 60 μm.

Figure 1B:
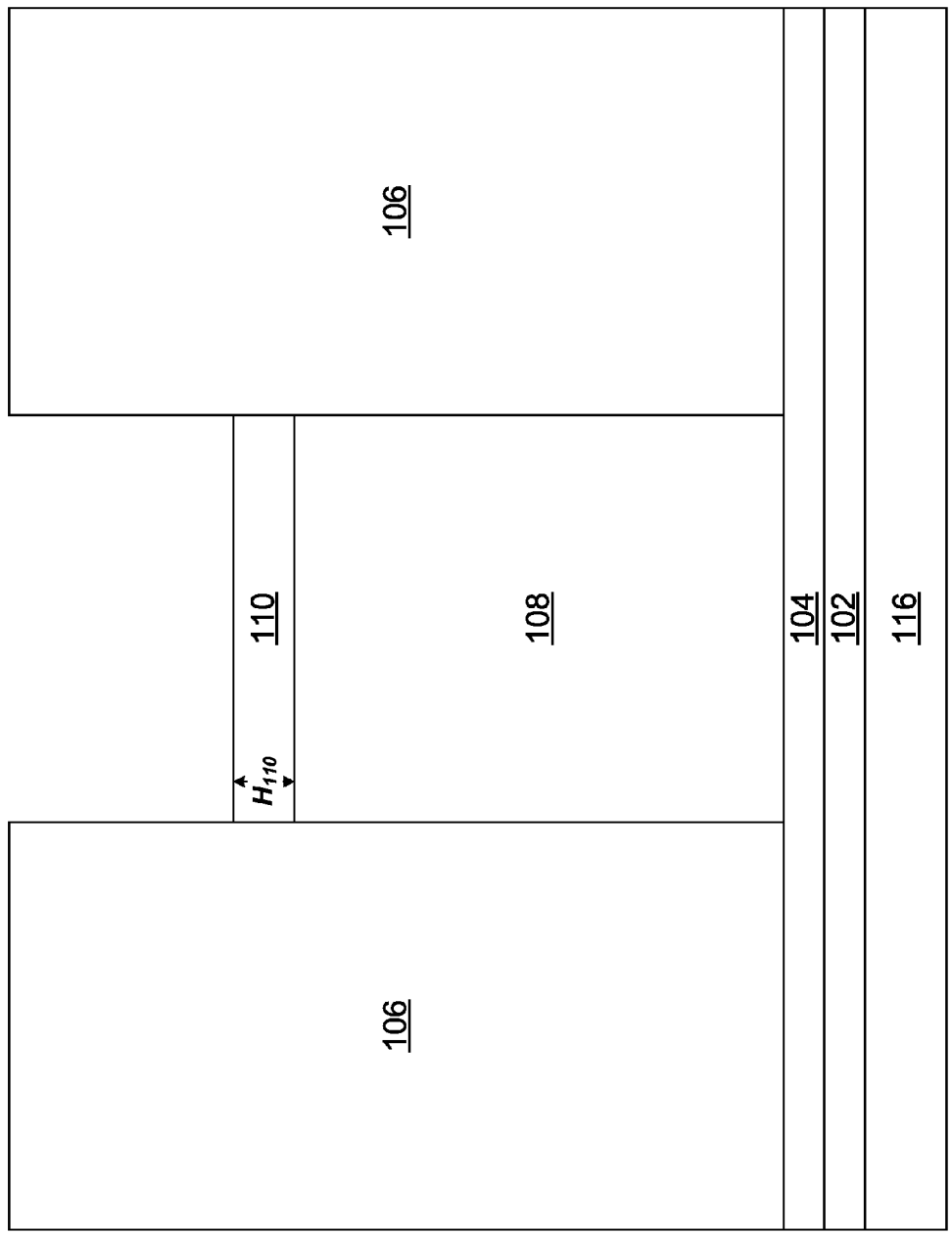

Referring now to FIG. 1B, a cross section view illustrating forming a plate 110 on the pillar 108 is shown. The plate 110 may be formed using any conventional deposition technique, such as those listed above. In an embodiment, the plate 110 may be formed using a plating technique, such as electroplating or an electroless/immersion plating bath. The plate 110 may provide a wettable surface for solder in subsequent processing steps. The plate 110 may be composed of a metal having a higher melting point than conventional solder materials (approximately 210° C. to approximately 230° C. for Sn or SnAg) to facilitate solder wetting in subsequent reflow steps. Examples of metals that may be used for the plate 110 include, but are not limited to nickel, gold, copper, or alloys thereof. In an embodiment, the plate 110 may be subjected to a reactive ion etching (RIE) process after it is deposited to clean the surface thereof. The plate 110 may have a height Hilo ranging from approximately 0.05 μm to approximately 1 μM.

Referring now to FIG. 1C, a cross section view illustrating forming a solder layer 112 on the plate 110 is shown. The solder layer 112 may be formed by depositing solder material in the opening (not shown) of the photoresist material 106 and on the plate 110 by using any conventional deposition technique, such as those listed above, as well as evaporation, plating, stencil printing, paste screening, molten solder injection, and electroplate soldering. The solder layer 112 may have a height $H_{112}$ ranging from approximately 2 μm to approximately 30 μm. The solder layer 112 may be formed on the plate 112 while the photoresist material 106 is still present, thereby protecting sidewalls of the pillar 114 (hereinafter "pillar sidewalls") from being exposed to any solder material.

In an embodiment, the solder layer 112 may be composed of more than one material, such as a lead-free alloy (e.g., gold, a tin/silver/copper alloy), a lead-containing alloy (e.g., a lead/tin alloy), copper, aluminum, a conductive polymer, or combinations thereof. In an embodiment, the solder layer 112 may be composed of multiple layers including, but not limited to, a lower adhesion layer (not shown), a middle layer (not shown), and a wettable upper layer (not shown). The lower adhesion layer may provide adhesion to the plate 110, and may also serve as a diffusion barrier. The lower adhesion layer may be composed of a conductive material, such as, but not limited to chromium, tantalum, tungsten, titanium, zirconium, and alloys and nitrides thereof. The middle layer may be solderable and may be composed of a conductive material such as, but not limited to, chromium, copper, aluminum, nickel, or alloys thereof. The wettable upper layer may allow for easy solder wettability and a fast reaction with solder. The wettable upper layer may be composed of a conductive material such as, but not limited to, copper.

Referring now to FIG. 1D, a cross section view illustrating removing the photoresist material 106 to form the pillar structure 100 is shown. In an embodiment, the photoresist material 106 may be stripped selective to the solder layer 112, the plate 110, the pillar 108, and the conductive layer 104 using conventional strippers. In an embodiment, the photoresist material 106 may be stripped using tetramethylammonium hydroxide (TMAH) with a high pH content, with glycol to assist in swelling, and N-methylpyrrolidone (NMP) to aid in dissolution. Alternatively, the photoresist material 106 can be stripped using sodium or potassium hydroxide.

After the pillar structure 100 is formed, a non-wettable organo-metallic layer may be formed on the sidewalls of the pillar to prevent solder from wetting on sidewalls of the pillar 108 during subsequent reflow/bonding steps. An embodiment by which to form this non-wettable organo-metallic layer is described in detail below by referring to the accompanying drawings FIGS. 2-7.

Referring now to FIG. 2, a cross section view illustrating removing a portion of the conductive layer 104 adjacent to the pillar 108 from the pillar structure 100 is shown. In an embodiment, the portion of the conductive layer 104 may be removed using an etching process, such as, for example, RIE. The portion conductive layer 104 may be removed selective to the solder layer 112, the plate 110, the pillar 108, and the liner 102. A portion of the conductive layer 104 may remain under the pillar 108, such that sidewalls of the conductive layer 202 (hereinafter "conductive layer sidewalls") are substantially flush with the pillar sidewalls 114. The liner 102 may extend beyond a width of the pillar 108.

Figure 3:
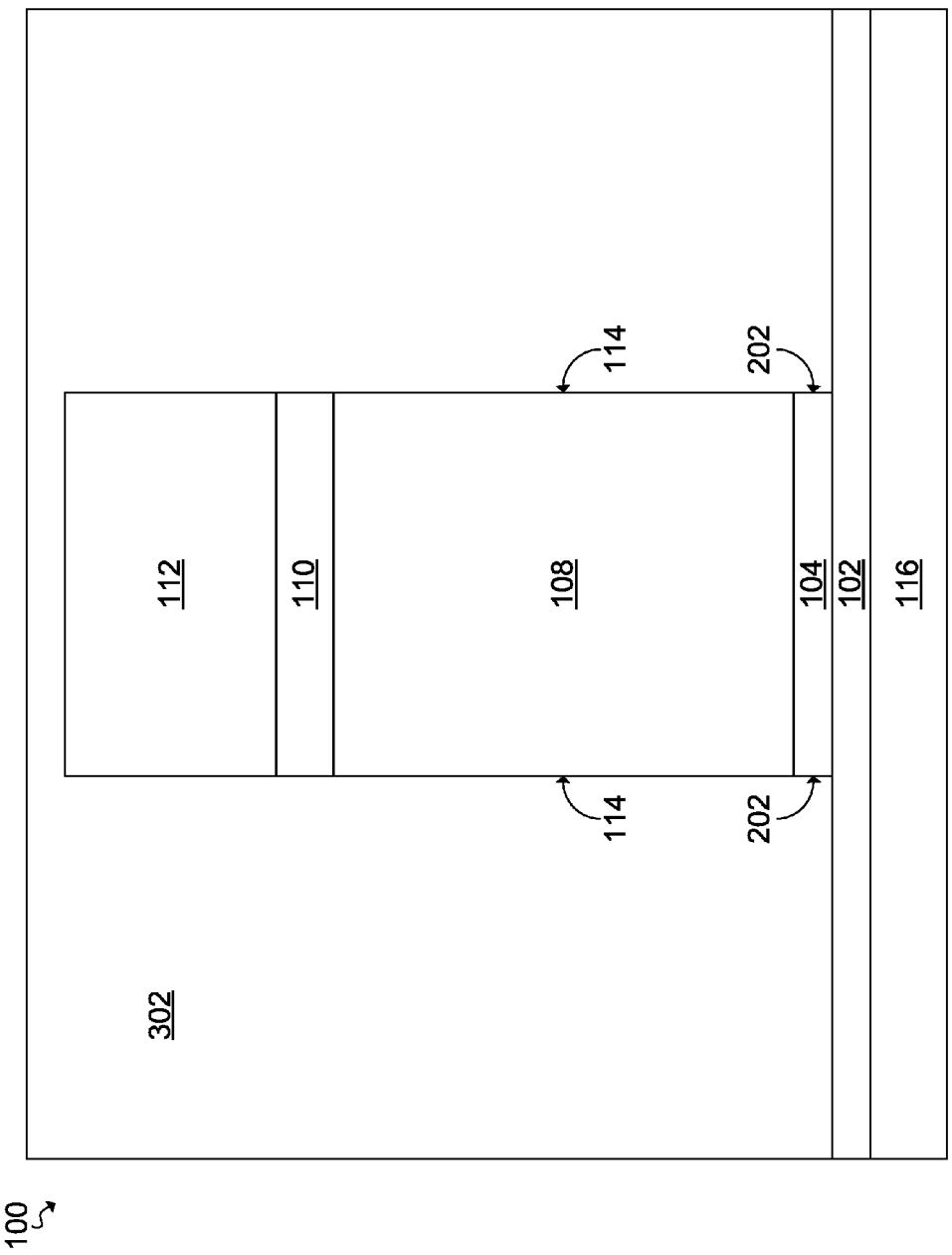
FIG. 3 is a cross section view illustrating forming an organic layer over the pillar structure, according an embodiment of the present invention.

Referring now to FIG. 3, a cross section view illustrating forming an organic layer 302 surrounding the pillar structure 100 is shown. The organic layer 302 may be formed so that it is in direct contact with at least a portion of the pillar sidewalls 114. In an embodiment, the organic layer 302 may be formed on the liner 102 and may be in direct contact with the conductive layer 104 and only a portion of the pillar sidewalls 114. In another embodiment, the organic layer 302 may be formed on the liner 102 and may be in direct contact with the conductive layer 104 and an entire length of the pillar sidewalls 114. In yet another embodiment, the organic layer 302 may be formed on the liner 102 and may be in direct contact with the conductive layer 104, the pillar sidewalls 114, the plate 110, and the solder layer 112. The organic layer 302 may be formed by any conventional deposition technique, such as, for example, ALD, CVD, LPCVD, PVD, MBD, PLD, LSMCD, sputtering, or spin-on deposition. The organic layer 302 may be composed of an organic material chosen for its tendency to react with the pillar 108 to form an organo-metal and for its ease of removal. In an embodiment, the organic layer 302 may be composed of a temporary adhesive polyimide, such as HD-3007 manufactured by HD Microsystems™, or another poly (amic) acid based polyimide commonly used in wafer to glass carrier processing.

Figure 4:
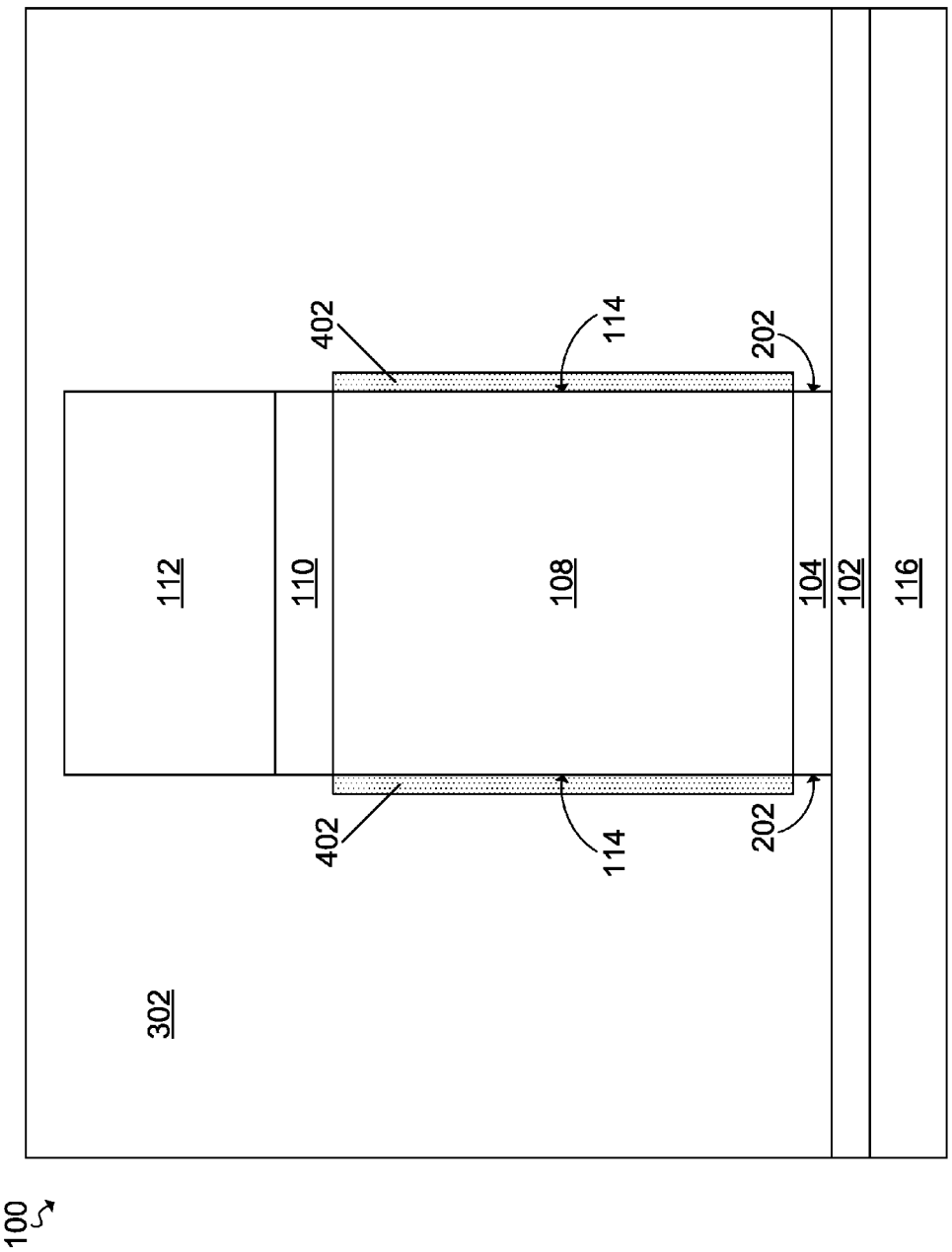
FIG. 4 is a cross section view illustrating forming an organo-metallic layer on pillar sidewalls is shown, according an embodiment of the present invention.

Referring now to FIG. 4, a cross section view illustrating forming a non-wettable organo-metallic layer 402 on the pillar sidewalls 114 is shown. The organo-metallic layer 402 may be formed by heating the organic layer 302, thereby facilitating a reaction between the copper in the pillar 108 and the organic material in the organic layer 302. In an embodiment, the organic layer 302 may be heated to approximately 150° C. to approximately 350° C. for a time of approximately 10 min to approximately 60 min by subjecting the pillar structure 100 to a conventional annealing process. In an embodiment, the organic layer 302 may only react with the pillar 108, resulting in the formation of the organo-metallic layer 402 only on the pillar sidewalls 114. In another embodiment, in which the conductive layer 104 may contain copper, the organo-metallic layer 402 may also form on the conductive layer sidewalls 202.

The organo-metallic layer 402 may form on portions of the pillar sidewalls 114 that are in direct contact with the organic layer 302. It is contemplated that the organo-metallic layer 402 may cover a sufficient portion of the pillar sidewalls 114 to reduce the amount of solder bridging to an adjacent pillar structure. In an embodiment, the organo-metallic layer 402 may cover an entire length of the pillar sidewalls 114. In another embodiment, the organo-metallic layer 402 may only cover a portion of the pillar sidewalls 114.

Figure 5:
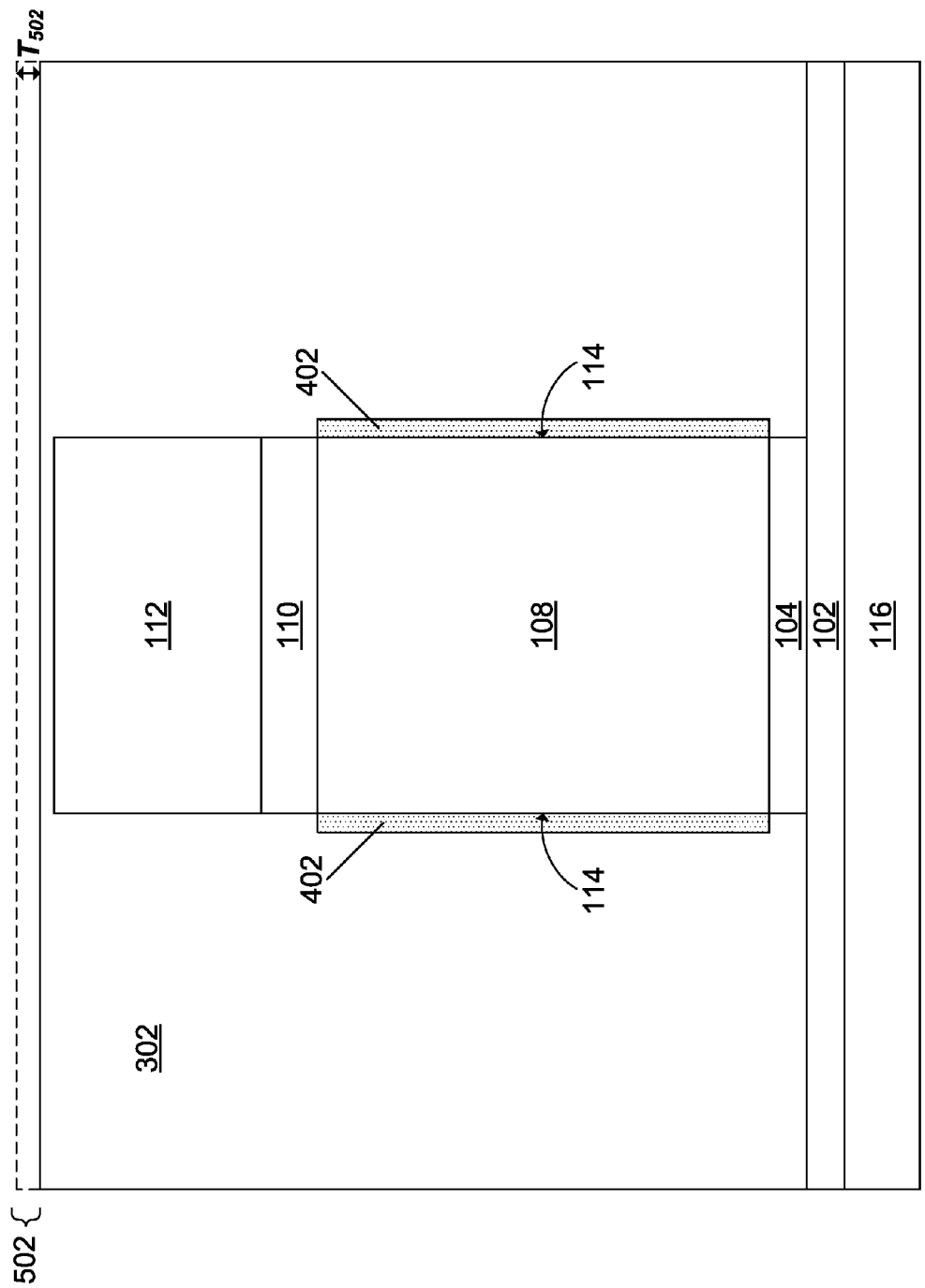
FIG. 5 is a cross section view illustrating removing a portion of the organic layer to prepare a remaining portion of the organic layer for stripping, according an embodiment of the present invention.

Referring now to FIG. 5, a cross section view illustrating removing a top portion 502 of the organic layer 302 (i.e., a top skin) to prepare it for stripping is shown. The top portion 502 may be removed using a dry removal technique, such as, for example, laser ablation or, a combination of RIE and oxygen ashing. The top portion 502 may have a thickness $T_{502}$ of approximately 300 nm to approximately 600 nm. Although embodiments are contemplated in which the organic layer 302 is stripped without first removing the top portion 502, removing the top portion 502 using laser ablation may prime the organic layer 302 for stripper removal, allowing for the organic layer 302 to be removed faster. This may thereby reduce exposure of the pillar structure 100 (FIG. 3) and the overall device to potentially damaging stripper chemistries and elevated temperatures. In an embodiment, the removal of the top portion 502 may reduce the amount of time required for subsequent solvent immersion from approximately 20-90 min to less than approximately 5 min.

Figure 6:
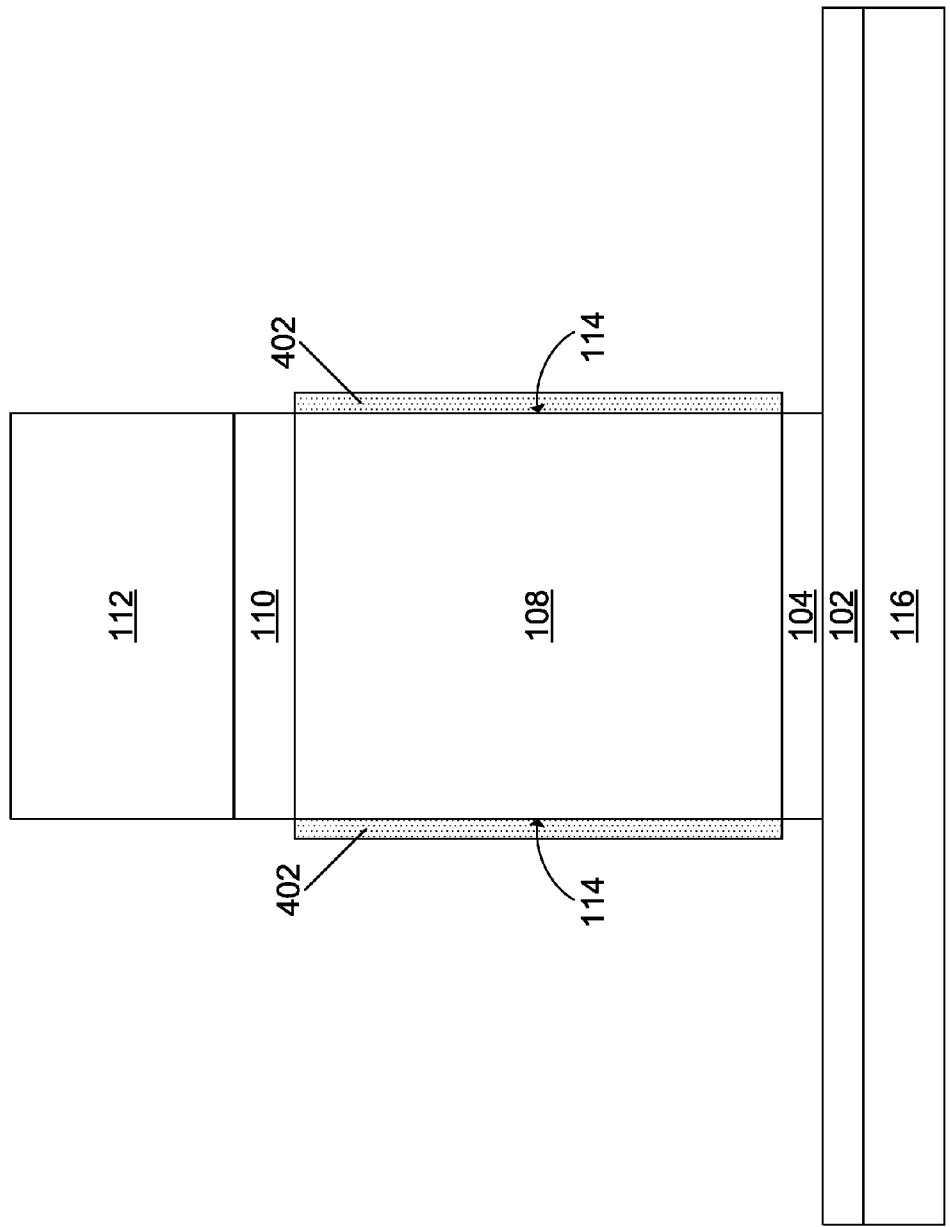
FIG. 6 is a cross section view illustrating removing the organic layer, according an embodiment of the present invention.

Referring now to FIG. 6, a cross section view illustrating removing the organic layer 302 (FIG. 5) is shown. In an embodiment, the organic layer 302 may be removed using a conventional stripping technique. The stripping technique may include immersing the pillar structure 100 and the organic layer 302 in a stripper solution for a time ranging from approximately 5 min to approximately 90 min to dissolve any un-reacted organic material in the organic layer 302 that did not react with the pillar 108 to form the organo-metallic layer 402. In an embodiment, the stripping technique may be performed for less than approximately 5 min. The type of solvent chosen for the stripping technique may depend on the organic material used to form the organic layer 302. Examples of solvents that may be used include, but are not limited to, N-methylpyrrolidone (NMP), dimethyl sulfoxide (DMSO), and water. The stripping technique may also include heating the pillar structure 100, the organic layer 302, and the solvent to a temperature of approximately 40° C. to approximately 120° C. in order to facilitate removal. It should be noted that the solvent used in the stripping technique may only react with the organic material of the organic layer 302 and not the organo-metallic layer 402. After the organic layer 302 is removed, a washing process may be used to remove any remaining solvent used in the stripping technique.

In an embodiment, a conventional ashing process may be used to remove any trace organic material left on the solder layer 112 after stripping. The ashing process may include using a pressure ranging from approximately 20 mTorr to approximately 150 mTorr, a power ranging from approximately 400 W to approximately 3000 W and a gas flow of approximately 200 sccm to approximately 3000 sccm depending upon the gases used. It should be noted that the ashing technique may only remove the trace organic material from the solder layer 112, and may not affect the organo-metallic layer 402.

Figure 7:
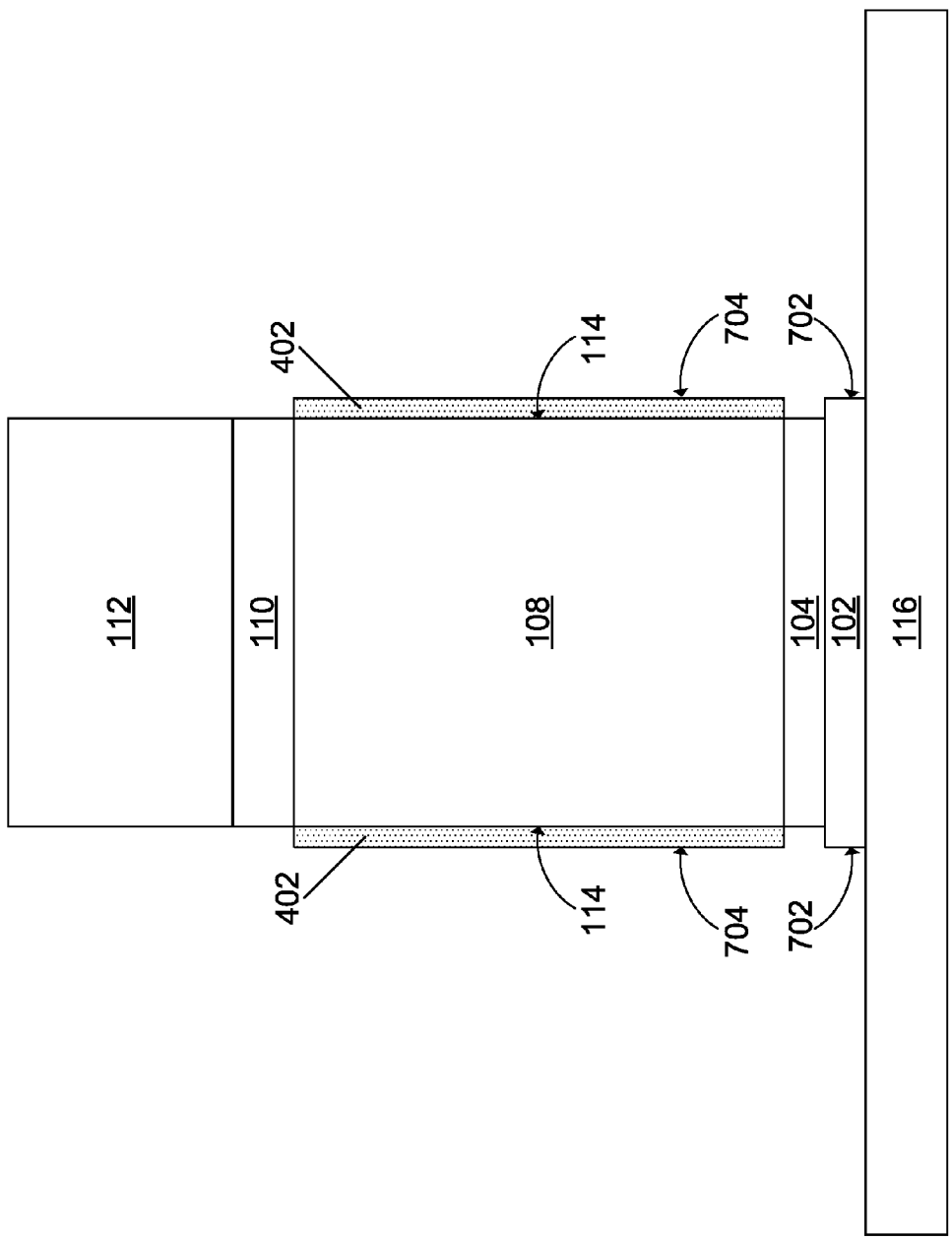
FIG. 7 is a cross section view illustrating removing a portion of a liner adjacent to the pillar, according an embodiment of the present invention.

Referring now to FIG. 7, a cross section view illustrating removing a portion of the liner 102 adjacent to the pillar 108 is shown. In an embodiment, the portion of the liner 102 may be removed using a dry etching process, such as, for example, RIE to expose the substrate 116. A portion of the liner 102 may remain below the remaining portion of the conductive layer 104. In an embodiment, the remaining portion of the liner 102 may extend beyond the remaining portion of the conductive layer 104 such that sidewalls 702 of the liner 102 (hereinafter "liner sidewalls") are aligned with outer sidewalls 704 of the organo-metallic layer 402.

After the portion of the liner 102 is removed, an additional ashing process may be used to remove any trace remnants of the liner 102 from the substrate 116. The ashing process may include using a pressure ranging from approximately 20 mTorr to approximately 150 mTorr, a power ranging from approximately 400 W to approximately 3000 W and a gas flow of approximately 200 sccm to approximately 3000 sccm depending upon the gases used.

Another embodiment by which to form the non-wettable organo-metallic layer on the sidewalls of the copper pillar to prevent solder from wetting on the pillar sidewalls during subsequent reflow/bonding steps is described in detail below with reference to FIGS. 8-12. It should be noted that the following stages of fabrication of the present embodiment described below may be preceded by the fabrication stages described above with reference to FIGS. 1A-1D. As such, the following description may continue after the description of FIG. 1D. In the present embodiment, a portion of the liner 102 may be removed before the organic layer 302 is deposited rather than after the formation and removal of the organic layer 302 as described above.

Figure 8:
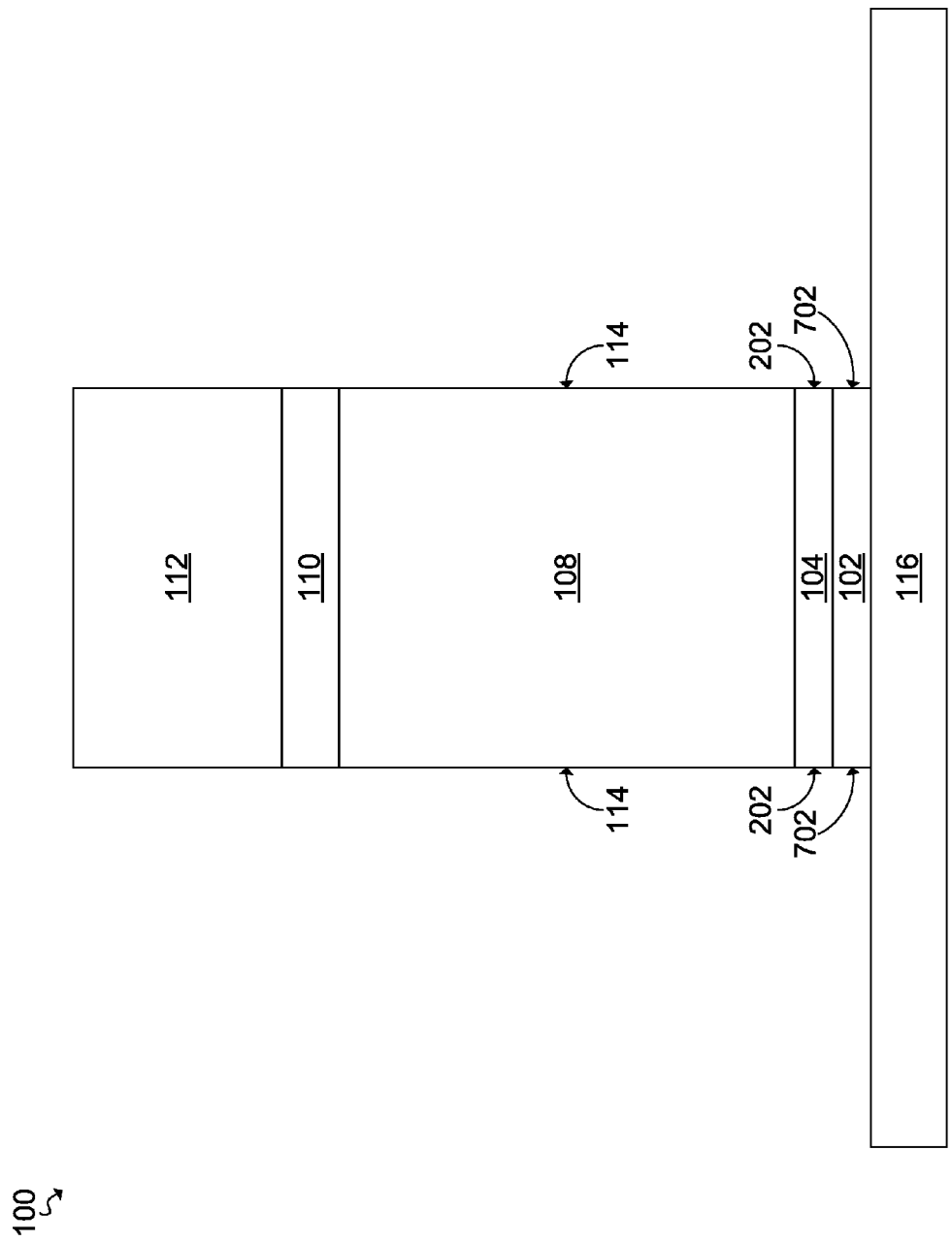
FIG. 8 is a cross section view illustrating removing a portion of the conductive layer and a portion of the liner from the pillar structure adjacent to the pillar, according an embodiment of the present invention.

Referring now to FIG. 8, a cross section view of the pillar structure 100 illustrating removing a portion of the conductive layer 104 and a portion of the liner 102 adjacent to the pillar 108 is shown. In an embodiment, the portion of the conductive layer 104 and the portion of the liner 102 may be removed using an etching process, such as, for example, RIE. The portion of the conductive layer 104 and the portion of the liner may be removed selective to the solder layer 112, the plate 110, the pillar 108, and the substrate 116. A portion of the conductive layer 104 and a portion of the liner may remain under the pillar 108, such that the conductive layer sidewalls 202 and the liner sidewalls 702 are substantially flush with the pillar sidewalls 114.

Figure 9:
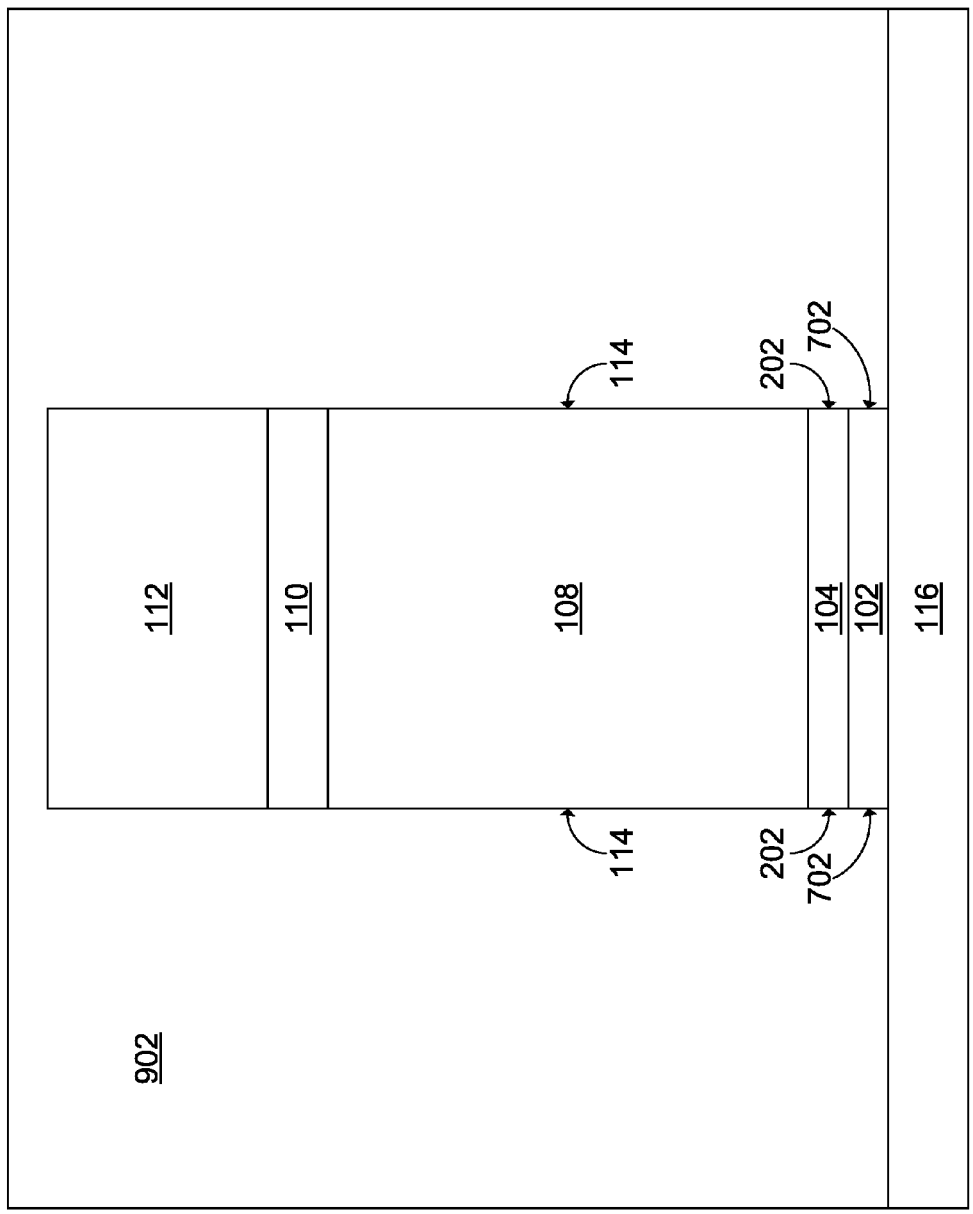
FIG. 9 is a cross section view illustrating forming an organic layer over the pillar structure, according an embodiment of the present invention.

Referring now to FIG. 9, a cross section view illustrating forming an organic layer 902 is shown. The organic layer 902 may be formed so that it is in direct contact with at least a portion of the pillar sidewalls 114. In an embodiment, the organic layer 902 may be formed on the substrate 116 and may be in direct contact with the liner 102, the conductive layer 104, and only a portion of the pillar sidewalls 114. In another embodiment, the organic layer 902 may be formed on the substrate 116 and may be in direct contact with the liner 102, the conductive layer 104, and an entire length of the pillar sidewalls 114. In yet another embodiment, the organic layer 902 may be formed on the substrate 116, and may be in direct contact with the liner 102, the conductive layer 104, the pillar sidewalls 114, the plate 110, and the solder layer 112. The organic layer 902 may be substantially similar to the organic layer 302 (FIG. 3) and may formed using substantially similar techniques as those described above with reference to FIG. 3.

Referring now to FIG. 10, a cross section view illustrating forming the organo-metallic layer 402 on the pillar sidewalls 114 is shown. The organo-metallic layer 402 may be formed using substantially similar techniques as those described above with reference to FIG. 4.

Referring now to FIG. 11, a cross section view illustrating removing a top portion 1102 of the organic layer 902 to prepare the organic layer 902 for stripping is shown. The top portion 1102 may be substantially similar to the top portion 502 (FIG. 5), including a thickness $T_{1102}$ that may be substantially similar to the thickness $T_{502}$, and may be removed using substantially similar techniques as those described above with reference to FIG. 5.

Referring now to FIG. 12, a cross section view illustrating removing the organic layer 902 (FIG. 11) is shown. The organic layer 902 may be removed using substantially similar techniques as those described above with reference to FIG. 6. In an embodiment, the outer sidewalls 704 of the organo-metallic layer 402 may extend beyond the conductive layer sidewalls 202 and the liner sidewalls 702.

Embodiments of the present invention may prevent solder from wetting on pillar sidewalls during reflow/bonding processes by forming a non-wettable organo-metallic layer on the pillar sidewalls after the pillar structure 100 is formed. The organo-metallic layer may be formed by depositing an organic layer, preferably an adhesive polymide, over the pillar structure, and causing the organic layer to react with copper in the pillar. Typically, the use of adhesive polymides may be avoided while fabricating C4 connections because of their tendency to react with copper capture pads, thereby preventing solder from wetting on the capture pad. Embodiments of the present invention take advantage of this otherwise detrimental effect by directing the formation of the organo-metallic only on areas in which the presence of solder material may be detrimental, specifically, the pillar sidewalls. The organo-metallic layer may prevent solder from wetting on the pillar sidewalls during subsequent reflow/bonding processes, thereby improving underfill flow, reducing solder bridging, and allowing for a tighter pillar pitch.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
  forming a pillar on an underlying layer, the underlying layer comprising a liner formed on a substrate and a conductive layer on the liner, wherein the liner extends beyond a width of the pillar structure and the conductive layer comprises a sidewall that is substantially flush with the sidewall of the pillar;
  forming a plate on an upper surface of the pillar;
  forming a solder layer only on an upper surface of the plate;

forming an organic layer on the underlying layer surrounding the pillar, such that a sidewall of the pillar and not an upper surface or bottom surface of the pillar is in direct contact with the organic layer;

annealing the pillar and the organic layer, such that an organic material in the organic layer and a metal in the pillar react to form a non-wettable organo-metallic layer along the sidewall of the pillar; and removing the organic layer, such that the non-wettable organo-metallic layer remains on the sidewall of the pillar;

removing a portion of the liner after removing the organic layer, such that a remaining portion of the liner has a sidewall that is substantially flush with an outer sidewall of the organo-metallic layer.

2. The method of claim 1, wherein the underlying layer comprises:

a liner formed on a substrate, the liner having a sidewall that is substantially flush with the sidewall of the pillar; and a conductive layer formed on the liner, the conductive layer having a sidewall that is substantially flush with the sidewall of the pillar.

3. The method of claim 1, further comprising:

removing a top portion of the organic layer before the removing the organic layer.

4. The method of claim 1, wherein the removing the organic layer comprises:

using a stripper to remove substantially all of the organic layer; and performing an ashing process to remove any remaining portions of the organic layer.

5. A method comprising:

forming an underlying layer comprising a liner formed on a substrate and a conductive layer on the liner;

forming a pillar structure on the underlying layer, the pillar structure having a pillar, a plate on an upper surface of the pillar, and a solder layer on the plate, wherein the liner extends beyond a width of the pillar structure and the conductive layer comprises a sidewall that is substantially flush with the sidewall of the pillar;

forming an organic layer on the underlying layer surrounding the pillar structure, the organic layer in direct contact with a sidewall of the pillar and not in contact with the upper surface of the pillar;

annealing the pillar structure and the organic layer, such that an organic material in the organic layer and a metal in the pillar react to form a non-wettable organo-metallic layer along the sidewall of the pillar; and removing the organic layer, such that the non-wettable organo-metallic layer remains on the sidewall of the pillar removing a portion of the liner after the removing the organic layer, such that a remaining portion of the liner has a sidewall that is substantially flush with an outer sidewall of the organo-metallic layer.

6. The method of claim 5, wherein the forming the pillar structure on the underlying layer comprises:

forming a photoresist layer on the underlying layer;

forming an opening in the photoresist layer to expose an upper surface of the underlying layer;

forming the pillar on the upper surface of the underlying layer;

forming the plate on the upper surface of the pillar;

forming the solder layer on an upper surface of the plate; and removing the photoresist layer.

7. The method of claim 5, wherein the underlying layer comprises:

a liner formed on a substrate, the liner having a sidewall that is substantially flush with the sidewall of the pillar; and a conductive layer formed on the liner, the conductive layer having a sidewall that is substantially flush with the sidewall of the pillar.

8. The method of claim 5, wherein the organic layer comprises a polymide adhesive.

9. The method of claim 5, wherein the removing the organic layer comprises:

using a stripper to remove the organic material selective to the pillar structure, the organo-metallic layer, and the underlying layer.

10. The method of claim 5, further comprising:

removing a top portion of the organic layer before the removing the organic layer.

11. The method of claim 5, further comprising:

performing an ashing process after the removing the organic layer.

12. A structure comprising:

a pillar on an underlying layer, wherein the underlying layer comprises a liner on a substrate, the liner having a sidewall that is substantially flush with an outer sidewall of the non-wettable organo-metallic layer;

a conductive layer on the liner, the conductive layer having a sidewall that is substantially flush with the sidewall of the pillar;

a plate on the pillar;

a solder layer on the plate, wherein the solder layer does not contact any portion of the pillar; and a non-wettable organo-metallic layer along a sidewall of the pillar.

13. The structure of claim 12, wherein the underlying layer comprises:

a liner on a substrate, the liner having a sidewall that is substantially flush with the sidewall of the pillar; and a conductive layer on the liner, the conductive layer having a sidewall that is substantially flush with the sidewall of the pillar.

14. The structure of claim 12, wherein the solder layer has a sidewall that is substantially flush with a sidewall of the plate.

* * * * *